United States Patent [19]

Lamatsch

[11] Patent Number: 5,627,482

[45] Date of Patent: May 6, 1997

[54] ELECTRONIC DIGITAL CLOCK DISTRIBUTION SYSTEM

[75] Inventor: Michael J. Lamatsch, Roseville, Minn.

[73] Assignee: Ceridian Corporation, Minneapolis, Minn.

[21] Appl. No.: 598,233

[22] Filed: Feb. 7, 1996

[51] Int. Cl.$^6$ .................................................... H03K 19/00
[52] U.S. Cl. ........................... 326/93; 326/101; 327/295; 327/304
[58] Field of Search .................... 326/93, 101; 327/262, 327/295, 300, 304, 319, 333

[56] References Cited

U.S. PATENT DOCUMENTS

| | | | |
|---|---|---|---|
| 3,851,098 | 11/1974 | Pingault | 327/304 |
| 4,638,256 | 1/1987 | Hong et al. | 328/105 |
| 5,140,184 | 8/1992 | Hamamoto et al. | 326/93 |
| 5,172,330 | 12/1992 | Watanabe et al. | 364/491 |
| 5,239,215 | 8/1993 | Yamaguchi . | |
| 5,254,886 | 10/1993 | El-Ayat et al. . | |
| 5,306,959 | 4/1994 | Knauft et al. . | |
| 5,307,381 | 4/1994 | Ahuja | 375/107 |
| 5,361,277 | 11/1994 | Grover | 375/107 |
| 5,371,417 | 12/1994 | Mirov et al. | 327/115 |
| 5,391,942 | 2/1995 | El-Ayat et al. | 326/39 |
| 5,398,262 | 3/1995 | Ahuja | 375/356 |
| 5,450,024 | 9/1995 | Ruegg | 327/333 |

OTHER PUBLICATIONS

Abstract—"Topological design of clock distribution networks based on non–zero clock skew specifications", Neves, J.L., Friedman, E.G., Proceedings of the 36th Midwest Symposium on Circuits and Systems, Aug. 16–18, 1993.

Abstract —"Clock distribution in general VLSI circuits", Ramanathan, P. Dupont, A.J.; Shin, K. G., IEEE Transactions Circuits and Systems I: Fundamental Theory and Applications, vol. 41, No. 5, May 1994.

Abstract —"Synchronous global clock distribution on multi-chip modules using optical waveguides", Koh, S.; Carter, H.W.; Boyd, J.T., Optical Engineering, vol. 33, No. 5, May 1994.

Abstract —"A new method for clock distribution", Grover, W. D., IEEE Transactions on Circuits and Systems I: Fundamental Theory and Applications, vol. 41, No. 2, Feb. 1994.

Abstract —"High reliability PLL based clock distribution", Rogers, A.C., Wescon/92 Conference Record, Nov. 17–19, 1992.

Abstract —"Synchronous optical clock distribution for optoelectronic interconnections", Schwider, J. et al.; Optics Letters, vol. 19, No. 2, Jan. 15, 1994.

Abstract —"A comparative study of clock distribution approaches for WSI", Nigam, N.; Keezer, D.C., 1993 Proceedings, Fifth Annual IEEE International Conference on Wafer Scale Integration, Jan. 20–22, 1993.

(List continued on next page.)

*Primary Examiner*—Edward P. Westin
*Assistant Examiner*—Jon Santamauro
*Attorney, Agent, or Firm*—Kinney & Lange

[57] ABSTRACT

More particularly, an electronic digital clock distribution system provides a plurality of working rank clock signals to respective ones of a plurality of logic circuits. Each clock signal has a predetermined frequency and each logic circuit requires a working rank clock signal having a predetermined level of electrical power. An oscillator produces a master clock signal at the predetermined frequency and at an electrical power level at least equal to the sum of the power requirements for all working rank clock signals of the plurality of logic circuits. An electronic splitter network is connected to the oscillator to splitting the master clock signal into the plurality of working rank clock signals.

12 Claims, 6 Drawing Sheets

OTHER PUBLICATIONS

Abstract –"High–speed clock distribution architecture employing PLL for 0.6 mu m CMOS SOG", Ishibashi, A.; Maeda, A.; Arakawa, T.; Higashitani, K.; Tatsuki, M., Proceedings of the IEEE 1992 Custom Integrated Circuits Conference, May 3–6, 1992.

Abstract –"ECL: the technology of choice for your clock distribution needs", Pearson, T., Wescon Conference Record, Nov. 19–21, 1991.

Abstract –"High speed clock distribution schemes–a critical comparison", Sfarti, A., Wescon Conference Record, Nov. 19–21, 1991.

Abstract –"Solving clock distribution problems in high speed systems", Frederick, R., Wescon Conference Record, Nov. 19–21, 1991.

Abstract –"Active compensation of interconnection losses for multi–GHz clock distribution networks", Bussmann, M.; Langmann, U., IEEE Transactions on Circuits and Systems II Analog and Digital Signal Processing, vol. 39, No. 11, Nov. 1992.

Abstract –"A graph theoretic approach to the clock distribution problem", Mukund, P.R.; Bouldin, D. W., Proceedings, Fourth Annual IEEE International ASIC Conference and Exhibit, Sep. 23–27, 1991.

Abstract –"ASIC clock distribution using a phase locked loop (PLL)", Ashby, L., Proceedings, Fourth Annual IEEE International ASIC Conference and Exhibit, Sep. 23–27, 1991.

Abstract –"A low power clock distribution scheme for complex IC system", Ta, P.D.; Do, K., Proceedings, Fourth Annual IEEE International ASIC Conference and Exhibit, Sep. 23–27, 1991.

Abstract –"Fanout analysis of multi–stage optical clock distribution using opticalamplifiers", Li, C.–S.; Tong, F.; Liu, K.; Messerschmitt, D. G., IEEE Global Telecommunications Conference, vol. 1, Dec. 2–5, 1991.

Abstract –"Design and evaluation of wafer scale clock distribution", Keezer, D. C., Jain, V. K., Proceedings, International Conference on Wafer Scale Integration, Jan. 22–24, 1992.

Abstract –"Skew–free clock distribution for standard–cell VLSI designs", Blair, G.M., IEE Proceedings G (Circuits, Devices and Systems), vol. 139, No. 2, Apr. 1992.

Abstract –"Clock distribution strategies for WSI: a critical survey", Keezer, D.C.; Jain, V.K., 1991 Proceedings, International Conference on Wafer Scale Integration, Jan. 29–31, 1991.

Abstract –"Clock distribution design success with advanced logic", Morgan, R.J., Northcon/89 Conference Record, Oct. 17–19, 1989.

Abstract –"Clock distribution design success with advanced logic", Morgan, R.J., Wescon/89, Conference Record, Nov. 14–15, 1989.

Abstract –"A dynamically tracking clock distribution chip with skew control", Chengson, D.; Costantino, L.; Khan, A.; Le D., Yue L., Proceedings of the IEEE 1990 Custom Integrated Circuits Conference, May 13–16, 1990.

Abstract –"Design and verification of clock distribution in VLSI", Keezer, D.C., IEEE International Conference on Communications ICC '90 Including Supercomm Technical Sessions, Supercomm ICC'90 Conference Record, Apr. 16–19, 1990.

Abstract –"Harmonic series analysis of digital clock distribution circuits", Kraft, C., Proceedings of the 32nd Midwest Symposium on Circuit and Systems, Aug. 14–16, 1989, vol. 1.

Abstract –"Clock distribution for fast computer networks", Becke, G.; Last, W., Elektronik, vol. 39, No. 14, Jul. 6, 1990.

Abstract –"A clock distribution scheme for nonsymmetric VLSI circuits", Ramanathan, P.; Shin, K.G., 1989 IEEE International Clonference on Computer–Aided Design, Digest of Technical Papers, Nov. 5–9, 1989.

Abstract –"Design and fabrication of HOE for clock distribution in integrated circuits", Prongue, D.; Herzig, H.P., Second International Conference on Holographic Systems, Components and Applications (Conf. Publ. No. 311), Sep. 11–13, 1989.

Abstract –"High performance clock distribution for CMOS ASICs", Boon, S., Butler, S.; Bryne, R.; Setering, B.; Casalanda, M.; Scherf, A., Proceedings of the IEEE 1989 Custom Integrated Circuits Conference, May 15–18, 1989.

"Fanout analysis of multi–stage optical clock distribution using opticalamplifiers", Li, C.–S.; Tong, F.; Liu, K.; Messerschmitt, D.G., IEEE Global Telecommunications Conference, vol. 1, Dec. 2–5, 1991.

"Synchronous optical clock distribution for optoelctronic interconnections", Schwider, J. et al. Optics Letters, vol. 19, No. 2, Jan.15, 1994.

"Synchronous global clock distribution on multichip modules using optical wageguides", Koh, S.; Carter, H.W.; Boyd, J.T., Optical Engineering, vol. 33, No. 5, May 1994.

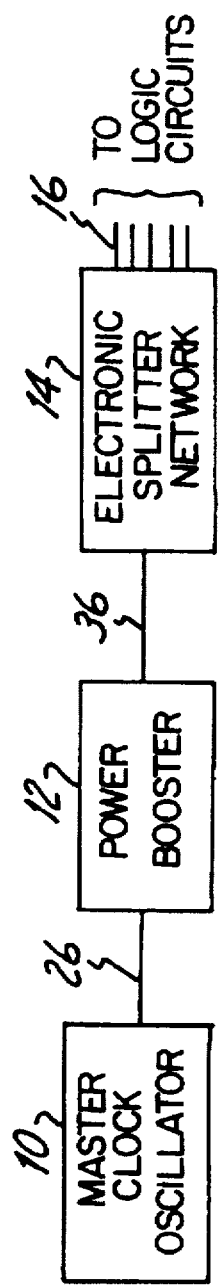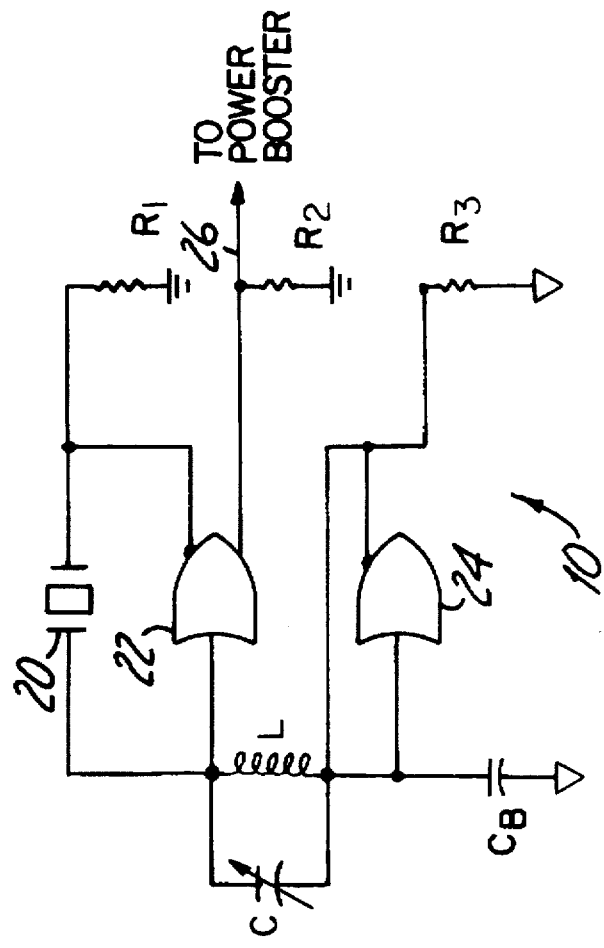

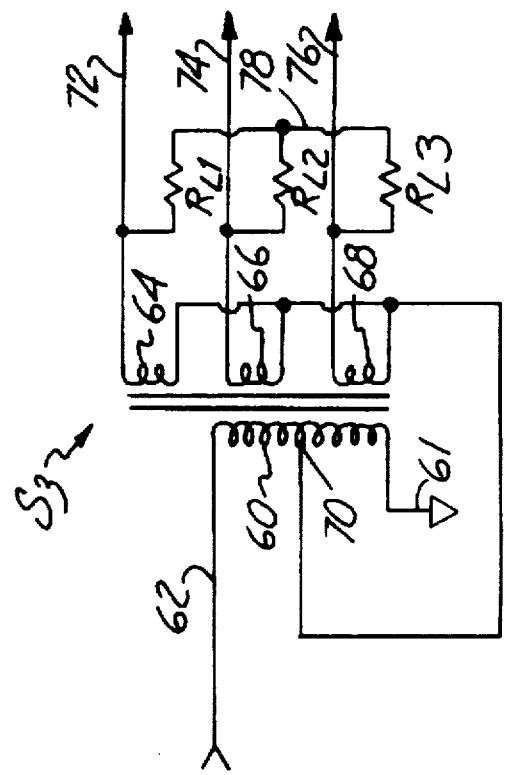
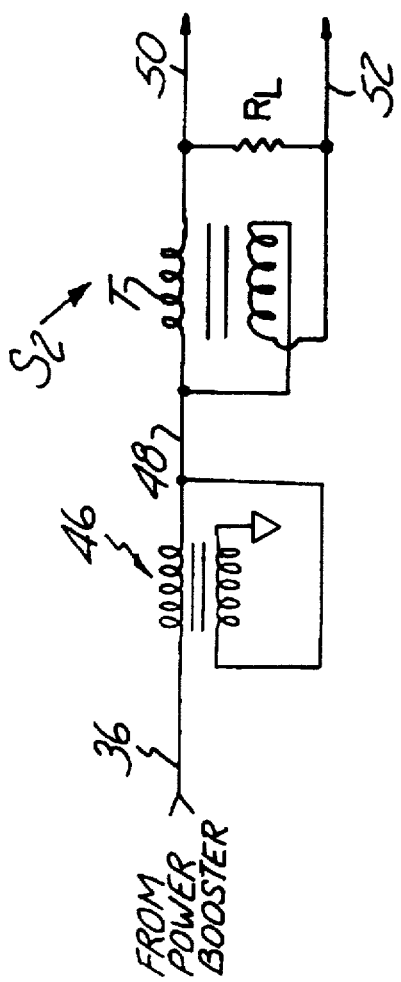
Fig. 4
Fig. 5

ELECTRONIC DIGITAL CLOCK DISTRIBUTION SYSTEM

BACKGROUND OF THE INVENTION

This invention relates to electronic digital clock distribution systems for digital circuitry, and particularly for use in digital processing equipment.

Present clock distribution systems for digital electronics employ high frequency oscillators to generate a master clock signal. Typically, the high frequency oscillator employs a crystal oscillator but other techniques such as a ring of gates, mechanical resonators and surface-acoustic-wave devices are also used. The signal produced by the master clock generator may be multiplied or divided to achieve the desired master clock signal frequency. The master clock signal is distributed through a clock distribution circuitry whose function is to reproduce (replicate) multiple copies of the original signal without distortion. The copies of the clock signal are forwarded to the logic circuits within the processor, or other digital electronic equipment, for use in a well known manner.

Copying or replication of clock signals entails reproduction of a wholly new clock signal by processing a signal of design power level from a power supply at a phase and frequency of an input (master) clock signal. Typical techniques for reproduction of a clock signal include switching the power signal by a switching circuit operated at the phase and frequency of the master clock signal, or by locking the phase and frequency of the reproduced signal onto that of the master clock signal through a phase locked loop (PLL). In either case, the master clock signal, and each reproduced clock signal is usually at a power level adequate to drive only a few logic circuits and is insufficient to operate all of the logic circuits.

Typical clock distribution circuits provide between 3 and 63 additional copies of the original clock signal. In large computing equipment, several thousand clock signals may be required for the various logic circuits, thereby requiring reproduction of clock signals from copies. Thus, logic circuits may receive first, second, third or even greater generation copies of clock signals.

Each time a clock signal is reproduced through a clock distribution circuit, a small amount of "skew" is generated between the output and input signals. More particularly, switching operations within the distribution circuit results in the leading and/or trailing edge of the output signal being slightly time delayed from that of the input signal. Where clock signals are generated at second, third, or greater generation copies, the amount of skew between working rank clock signals of various generations may vary, resulting in the logic circuits being clocked by signals slightly skewed from each other. Moreover, it is common to distribute the clock generation function to several circuit boards to generate working rank clock signals on the board where they are needed, rather than transport the working rank clock signals by hard wire to the boards. Differences in processes and materials forming various boards of a processor may result in different skew generation by duplication circuits of the same rank or generation. Variations in clock skew reduces the amount of time available to perform logic operations, reduces the capability of the logic circuits, and reduces the overall speed of the machine.

Numerous techniques are employed for reducing clock skew, including synchronizing the clock signals to the leading or trailing edge of the master clock, the use of active circuitry to reduce the skew, and employing fast distribution circuits so that variation in output timings of the several copies will be small. Emitter-coupled logic (ECL) circuits are rapid in operation but have a practical switching limit of about 25 picoseconds (psec) with a typical worst case variability of about 50 psec at ordinary ambient temperature and power supply variations. For various packages of ECL circuits, skew differences can be as much as 200 psec for differential signals and 400 psec for single-ended signals.

Active circuits such as programmable delay circuits reduce skew by inserting a delay into the clock signal paths, thereby bringing them into synchronism. Active circuits such as PLL oscillators regenerate the output clock signals by synchronizing to the incoming reference clock signal. However, programmable delays and PLL circuits require a considerable amount of space on circuit boards and require at least one stage for each output signal. Moreover, unwanted delay to the machine is introduced by active circuits.

(Some PLL circuits generate more than one copy of the incoming signal. In such cases, only one copy is truly referenced to the incoming signal and all other outputs are subject to the same skew problems as a conventional distribution circuit. Using ECL logic, PLL circuits often generate 500 psec to 2 nanoseconds (nsec) skew between output reproductions of the clock signal.)

Complementary metal oxide semiconductor (CMOS) logic circuits typically require clock signals having about 20–25 milliwatts (mW) of power; transistor-transistor logic (TTL) circuits typically require clock signals at about 10 mW; emitter-coupled logic (ECL) circuits typically require clock signals of about 2 mW; low voltage differential signaling. (LVDS) logic circuits typically require about 50 microwatts (µW) of power. Buffered crystal oscillators typically are capable of producing about 2 to 5 watts, and are therefore ideally capable of supporting 1000 to 2500 ECL circuits, 200 to 500 TTL circuits or 100 to 200 CMOS circuits. Prior clock distribution circuits could not readily reproduce working rank clock signals capable of handling the power requirements of diverse circuit types. Hence, the reproduction of clock signals has entailed generation of new signals, with desired power capabilities for a single class of logic circuits, that are timed to and based on the original clock signal. One problem, however, with prior distribution circuits is that each distribution circuit consumed 25 to 100 mW of power, thereby detracting from the available power for the logic circuits and generating undesirable heat. As a result of power consumption of prior distribution circuits, a 2 watt buffered oscillator was actually able to support only about 500 ECL circuits, rather than 1000 under ideal conditions.

SUMMARY OF THE INVENTION

The present invention is directed to an electronic digital clock distribution circuit employing a master clock oscillator, power booster, and electronic signal splitters designed to split the master clock signal to working rank clock signals having a fraction of the power of the input clock signal from the power booster. The exact fraction is dependant upon the number of working clock rank signals produced by the splitter.

More particularly, an electronic digital clock distribution system provides a plurality of working rank clock signals to respective ones of a plurality of logic circuits. Each clock signal has a predetermined frequency and each logic circuit requires a working rank clock signal having a predetermined level of electrical power. An oscillator produces a master clock signal at the predetermined frequency and at an electrical power level at least equal to the sum of the power requirements for all working rank clock signals of the plurality of logic circuits. An electronic splitter network is connected to the oscillator to split the master clock signal into the plurality of working rank clock signals.

In a preferred form of the invention, the electronic splitter network includes a cascaded tree containing a plurality of ranks of splitter stages, with each splitter stage including a primary winding electromagnetically coupled to at least one secondary winding. The primary winding receives a clock signal input and the secondary winding providing n outputs each arranged to provide a clock signal, each output clock signal having a power approximately 1/n the power of the input clock signal. Preferably, each secondary winding is connected between a respective output and an impedance matching tap of the primary winding, and a load impedance is connected between a respective output and an impedance bus.

In one form of the invention, the, primary winding has a first end connected to the input and a second end connected to a source of bias voltage.

Also preferably, there are at least two ranks of splitter stages, a first rank comprising a single splitter stage receiving the master clock signal as an input and the splitter stages forming the nth rank of splitter stages provide the plurality of working rank clock signals, each splitter stage forming the first through n−1 rank splitter stages providing intermediate clock signals to respective splitter stages forming the next higher rank of splitter stages and each splitter stage forming the second through nth rank splitter stages receiving intermediate clock signal signals from respective splitter stages forming the next lower rank of splitter stages.

In another form of the invention, the oscillator includes a power booster connected to the oscillator for increasing the power of the source clock signal to the level of the master clock signal.

In another form of the invention, the oscillator includes a crystal oscillator.

In another form of the invention, an electronic digital clock distribution system provides a plurality of working rank clock signals to respective ones of a plurality of logic circuits, each clock signal having a predetermined frequency. The distribution system comprises an oscillator producing a master clock signal having the predetermined frequency and an electrical power level less than the sum of the power requirements for all working rank clock signals of the plurality of logic circuits. A power booster is connected to the oscillator to increase the power of the master clock signal to a power level at least equal to the sum of the power requirements for all working rank clock signals of the plurality of logic circuits. An electronic splitter network is connected to the power booster for splitting the master clock signal into the plurality of working rank clock signals. The electronic splitter network comprises a plurality of ranks of splitter states. Each splitter stage has a primary winding having first and second ends and an impedance matching tap, an input connected to a first end of the primary winding and arranged to receive a clock signal, a plurality of secondary windings electromagnetically coupled to the primary winding, each secondary winding having a first end connected to a respective output to provide a respective output clock signal having a power approximately 1/n the power of the input clock signal, each secondary winding further having a second end connected to the impedance matching tap of the primary winding, and a source of bias voltage connected to the second end of the primary winding. Respective ones of a first group of the logic circuits are connected to respective ones of the outputs of a first splitter stage, and respective ones of a second group of the logic circuits being connected to respective ones of the outputs of a second splitter stage. The logic circuits of the first group being of a first class requiring working rank clock signals having a first predetermined bias level and the logic circuits of the second group being of a second class requiring working rank clock signals having a second predetermined bias level. The source of bias voltage connected to the second end of the primary winding of the first splitter stage has the first predetermined bias level and the source of bias voltage connected to the second end of the primary winding of the second splitter stage has the second predetermined bias level.

In accordance with one feature of the invention, the logic circuits of the first group require working rank clock signals having a first predetermined power level and the logic circuits of the second group require working rank clock signals having a second predetermined power level. The secondary windings of the first splitter stage provide respective output clock signals having a power at least as great as the first predetermined power level and the secondary windings of the second splitter stage provide respective output clock signals having a power at least as great as the second predetermined power level.

BRIEF DESCRIPTION OF THE DRAWINGS

FIG. 1 is a block diagram of a clock distribution circuit in accordance with the presently preferred embodiment of the present invention.

FIG. 2 is a circuit diagram of a typical master clock oscillator useful in the circuit of FIG. 1.

FIG. 4 is a circuit diagram of a two-output splitter stage and impedance match useful in the tree shown in FIG. 3.

FIG. 5 is a circuit diagram of a three-output splitter stage useful in the tree illustrated in FIG. 3.

DETAILED DESCRIPTION OF THE PREFERRED EMBODIMENTS

Figure 3:
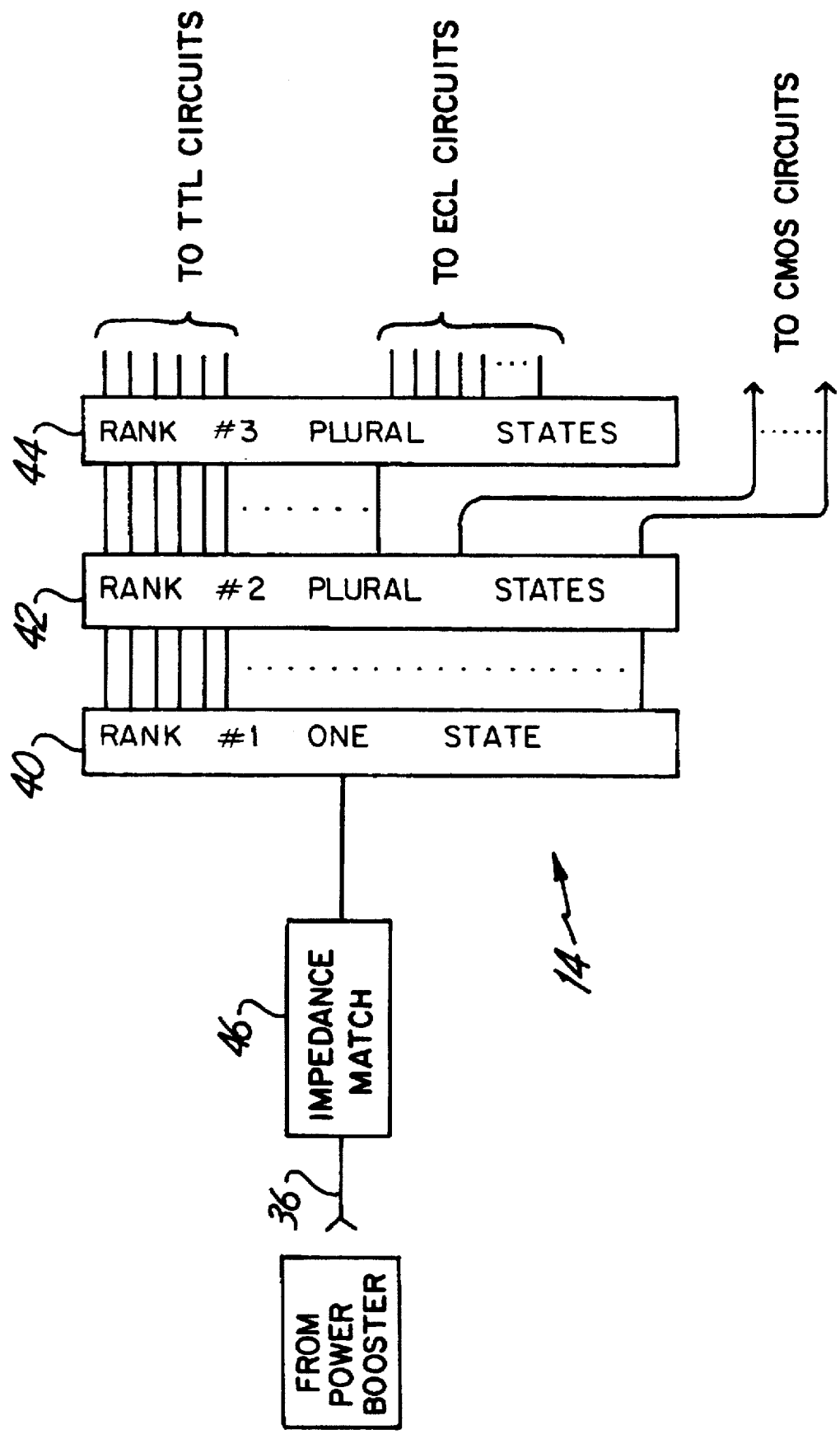
FIG. 3 is a block diagram of a cascaded tree forming the splitter network of FIG. 1.

Prior clock distribution systems employed a master clock oscillator that produced a master clock signal. A clock distribution tree responded to the master clock signal to produce the working rank clock signals for each logic device in the equipment. The clock distribution tree was composed of plural replication circuits arranged in an inverse pyramid, each replication circuit receiving a clock signal from the prior clock replication circuit (or from the master clock oscillator in the case of the first clock replication circuit on the tree) and generating new clock signals intended to replicate the incoming clock signal. The master clock oscillator and each clock replication circuit provided clock signals having a signal power that was quite low compared to the overall power requirements of the machine. A power supply provided power to each clock replication circuit to add power necessary to support that circuitry section. Hence, for a tree or pyramid of clock replication circuits containing n ranks or levels of circuits, power was added at each level so that the overall power level of the distribution system was maintained approximately constant throughout the distribution tree. Hence, the clock signals were reproduced or replicated, as opposed to divided, by the clock distribution system.

Each clock replication circuit introduced a time delay between the input and output clock signals. Hence, the output clock signals were time shifted, or skewed, from the input clock signal. Ideally, prior clock distribution systems introduced the same amount of skew along each branch of the tree or pyramid, but the ideal conditions did not always exist. For example, it is common to distribute the clock distribution tree over several circuit boards so that the clock replication of the last rank circuits are on the same circuit boards as the logic circuits being clocked. Moreover, if various logic circuits are driven by working rank clock signals generated at different ranks of the tree, skew between ranks, and hence the logic circuits, was generated. Additionally, the clock replication circuits are active circuits, sensitive to signal timing and providing output signals affected by fabrication and environmental conditions of the board on which the replication circuit is fabricated. Differences in transmission lines, fabrication techniques of the several boards, etc., caused different delays to be introduced along different paths, resulting in working rank clock signals that were slightly skewed from each other, even at the same rank.

FIG. 1 is a block circuit diagram of a basic clock distribution system in accordance with the presently preferred embodiment of the present invention. The clock distribution circuit employs a master clock oscillator 10, which provides a master clock signal to a power booster 12. Power booster 12 increases the power of the master clock signal to a level adequate to meet the power demands of the entire electronic machinery, not just the first stage or ranks of the distribution circuit. In a typical computing application, the power booster would boost the power from the master clock oscillator to between 5 and 100 watts, depending upon the type and number of logic circuits. Hence, a 5 watt power booster might support up to 2500 ECL circuits, but only about 200 CMOS circuits. On the other hand, a 100 watt power booster would support up to 50,000 ECL circuits or 5,000 CMOS circuits. The power boosted master clock signal is provided to an electronic splitter network 14, which provides the working rank clock signals to the logic circuits at output 16.

FIG. 2 illustrates a typical master clock oscillator 10 employing a crystal oscillator 20 connected between the input and inverted output of gate 22. An L-C tuning circuit composed of capacitor C and inductor L is connected between the inputs of gates 22 and 24. The inverted output of gate 24 provides a reference level to its input and to one side of bypass capacitor $C_B$. Pulldown resistors $R_1$, $R_2$ and $R_3$ are connected to the inverted and non-inverted outputs of gate 22 and the inverted output of gate 24, respectively. The non-inverted output of gate 22 provides an output 26 to power booster 12.

In its simplest form, the power booster 12 may be simply a power amplifier designed to produce as much as 5 watts of power for electronic splitter network 14. One such amplifier is an MHW 6342 CATV amplifier commercially available from Motorola Corporation which provides a 5 watt output over a frequency range of 40 MHz to 550 MHz.

FIG. 3 is a block diagram of an electronic splitter network 14 in accordance with the presently preferred embodiment of the present invention. The power splitter 14 comprises a tree or inverse pyramid formed of several ranks 40, 42 44 of individual splitter stages S. The tree illustrated in FIG. 3 comprises three ranks of splitter stages, the first rank comprising a single splitter stage, with succeeding ranks each containing plural splitter stages. As will be more fully understood hereinafter, the number of splitter stages in a given rank following first rank 40 is dependent in part on the type (number of outputs) of the stages of the prior rank and the number of outputs of the stages of the prior rank directed to clock logic circuits. First rank 40 has a single splitter stage because there is only one input from power booster 12. There may be any convenient number of ranks, each containing splitter stages having plural outputs, the size and number of ranks and stages being limited only by the number and type of logic circuits supported and the power constraints of power booster 12.

Additionally, outputs to various classes of logic circuits may be taken at the same or different ranks, depending on the power requirements for the logic circuits and the type of splitter stage employed. Hence, as illustrated in FIG. 3, clock outputs to the CMOS circuits are taken at second rank 42, whereas the outputs for the TTL and ECL circuits are taken from third rank 44. Additionally, if the splitter network is not impedance matched to power booster 12, impedance matching circuit 46 may be included at the input to first rank 40.

FIG. 4 illustrates a two-output splitter stage $S_2$ comprising a transformer T having a pair of windings arranged so that the primary winding is connected between input 48 and a first output 50, and the secondary winding is connected between input 48 and a second output 52. Transformer T preferably includes a magnetic core, although an air core would be adequate. In any case, the electric field coupling of the windings supports high frequencies for good pulse edge definition. The windings are either oppositely wound or are oppositely connected as illustrated in FIG. 4 so that the signals appearing at outputs 50 and 52 are exactly in phase and frequency with each other, and with the input signal at input 48. A load resistor, $R_L$ is connected between outputs 50 and 52, and is sized to balance the impedance of the splitter stage. For example, for a 12½ ohm input at 48 to produce 25 ohm outputs at each of outputs 50 and 52, load resistor $R_E$ would be a 50 ohm impedance.

FIG. 4 also illustrates a form of impedance match circuit 46 comprising a transformer having its primary winding connected between output 36 from power booster 12 and input 48 to splitter stage S, and a secondary winding connected between input 48 and ground. The impedance match is used in cases to match the impedance of the first splitter stage to the output of the power booster or oscillator, as the case may be. The impedance of subsequent stages are matched by the load impedances $R_L$ of the several stages.

FIG. 5 illustrates a three-output splitter stage $S_3$ comprising a magnetic core transformer having a primary winding 60 coupled between input 62 and a fixed voltage level at 61, such as ground. In the case of three outputs, the transformer has three secondary windings 64, 66 and 68, each having one side connected together and to an impedance matching tap 70 of primary winding 60, and an opposite side connected to a respective output 72, 74 and 76. A load resistor $R_{L1}$, $R_{L2}$ or $R_{L3}$ is connected between the respective output 72, 74 or 76 and a common bus 78. Each load resistance is of equal value to each other load resistance of the stage so that the impedance between outputs equals $2R_L$. For impedance matching purposes, the common connection of the secondary windings are connected to tap 50 at a position based on the parallel impedances of the load resistors. The turns ratio of the primary winding is $$\sqrt{\frac{Z_{input}}{Z_{load}}}, \text{ where}$$

$Z_{input}$ is the input impedance and $Z_{output}$ is the effective load impedance. For example, for a 50 ohm system (each stage matched to prior and successive states at 50 ohm impedances) each load resistor has an impedance of 50 ohms. The effective load impedance ($Z_{output}$) of three parallel 50 ohm load resistors is 16⅔ ohms, and the input impedance ($Z_{input}$) is 50 ohms. Therefore, the turns ratio is 0.578 for the example, meaning that 578 turns of a 1000 turn primary winding appear between the impedance matching tap and ground. Conveniently, a 12 turn winding may approximate the same result arranging the impedance matching tap so that five turns of the primary winding are between input 62 and tap 70 and seven turns are between tap 70 and the voltage level 61. Such an approximation will result in an input impedance of 49.1 ohm for a 50 ohm load.

It will be appreciated that the example of three secondary windings is given by way of example. Conveniently, any number of secondary windings may be employed between 2 and 64 or more, each secondary winding providing a separate output. Each splitter output has a load impedance $R_L$ connected between it and each other output, such as through common connection 78. As described, it is preferred that the turns ratio of the input winding for the splitter stage be adjusted to match impedances as nearly as practical.

Figure 6:
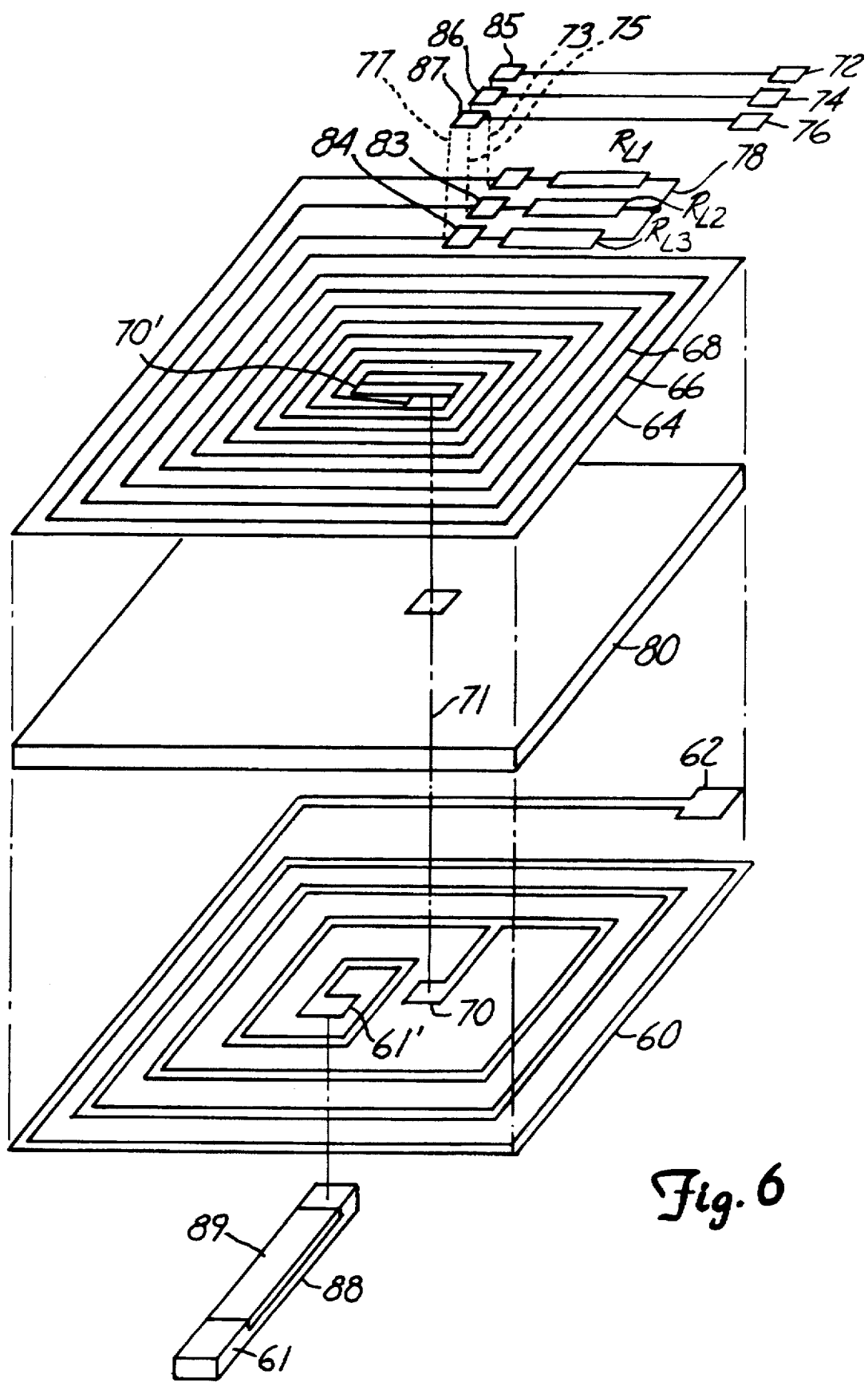
FIG. 6 is a exploded perspective view of several layers of a printed circuit board containing a printed circuit version of a splitter stage of FIG. 5.

FIG. 6 is a perspective view of the thin-film splitter stage shown in FIG. 5. Primary winding 60 is deposited or otherwise formed on a substrate or other support (not shown for sake of clarity) between tab 61' and terminal pad 62. Pad 62 corresponds to input 62 in FIG. 5. Tab 70 is connected to a central portion of winding 60 and forms the impedance matching tap 70 in FIG. 5. Tab 70 is connected by a conductive post illustrated by dashed line 71 to tab 70' of secondary windings 64, 66 and 68. Secondary windings 64, 66 and 68 are concentrically wound between tab 70' and respective tabs 82, 83 and 84. A layer 80 of magnetic material, such as Permalloy, is between primary coil 60 and secondary coils 64, 66 and 68. Suitable insulator layers (not shown) are positioned between the respective coils and the magnetic layer 80 and over the coils. Tabs 82, 83 and 84 are connected to respective output pads 72, 74 and 76 by conductive posts illustrated at 73, 75 and 77 and pads 85, 86 and 87. Pads 82, 83 and 84 are connected to one side of a thin film load resistor $R_{L1}$, $R_{L2}$ and $R_{L3}$, respectively, the opposite side of the load resistors being connected together by a conductor 78 to complete the circuit. The load resistors are insulated from the conductors of coil 64, 66 and 68. A conductive bridge 88, including insulator material 89 (which may be part of a insulating layer below primary coil 60) connects tab 61' to terminal 61, which corresponds to fixed voltage level 16 in FIG. 5. Terminal 61 is connected to an external source, such as a ground plane or other reference voltage.

The structure illustrated in FIG. 6 may be formed by selective etching the outside conductive layers of a 5-layer multi-layer circuit board to the patterns of the primary winding 60 on one side and secondary windings 64, 66 and 68 on the other side. In such a case, the multi-layer board comprises a center core formed of magnetic material, such as Permalloy, separated from the two outside conductive layers forming the coil structures by suitable insulation layers. The connection between tab 70 and terminal 70' of the secondary windings is formed by a conductive bridge around the coils, or a plated-through hole through the magnetic layer. If the magnetic material forming the center magnetic layer is conductive, the plated-through hole should be insulated to prevent connection of the coils to the magnetic layer. The resistance structure and the conductive bridge may be deposited, plated and/or etched, by well known techniques.

Alternatively, the structure of FIG. 6 may be formed by deposition techniques onto a substrate (not shown) by depositing successive layers of materials through aligned masks, in a, manner well-known in the art. In either case, the result is a thin-film splitter stage that can be incorporated into a circuit board for using the same process steps as used to form the various logic circuitry.

Figure 7:
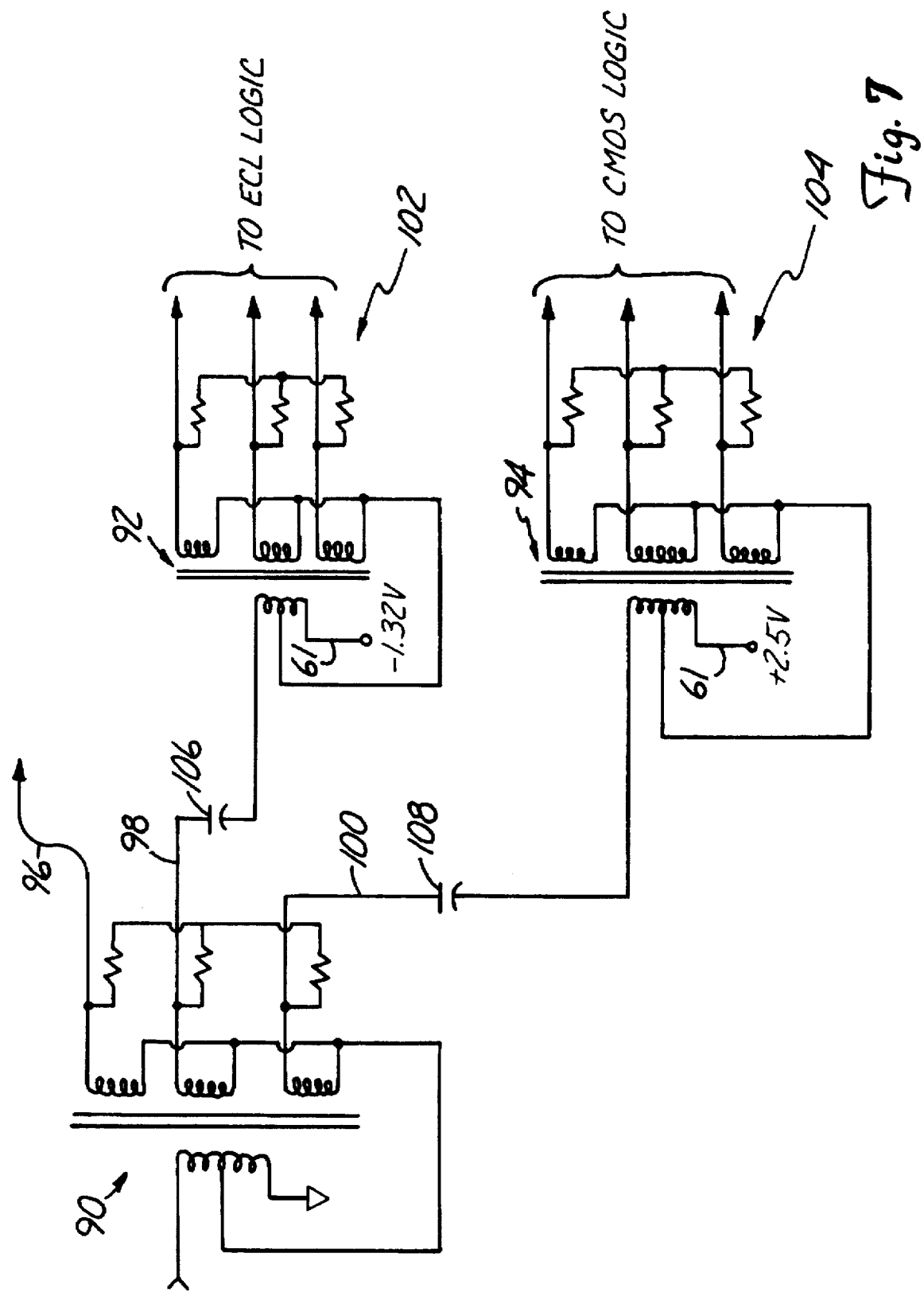
FIG. 7 is a circuit diagram illustrating connection of two levels of splitter stages shown in FIGS. 5 and 6.

FIG. 7 illustrates a portion of two ranks of a splitter network employing splitter stages shown in FIG. 5. Splitter stage 90 is in a first rank, and splitter stages 92 and 94 are in a second rank. Splitters 90, 92 and 94 are shown as three-output splitter stages, but it is understood that the number of outputs of any given splitter stage may be any convenient number. Splitter stage 90 has outputs 96, 98 and 100. Output 98 is connected to the input of splitter stage 92, and output 100 is connected to the input of splitter stage 94. Output 96 may be unused, in which case it is present for future use or impedance matching purposes, or may be connected to logic circuits or the input of another splitter stage at the same level as splitter stages 92 and 94. Splitter stage 92 has outputs at 102, that might, for example, be connected to ECL logic circuits. Splitter stage 94 has outputs 104 that might, for example, be connected to the clock inputs of CMOS logic circuits.

Assuming approximately 225 mW of power is applied to the clock signal appearing at the input to splitter stage 90, each output 96, 98 and 100 provides approximately 75 mW of power to the respective stage at the next rank. Hence, the input clock signals to each of splitter stages 92 and 94 are approximately 75 mW. Splitter stage 94, intended to drive CMOS logic circuits requiring approximately 25 mW each, splits the 75 mW clock signal to produce three 25 mW clock signals. Since ECL circuits connected to the outputs 102 of splitter stage 92 require only about 2 mW of power each, splitter stage 92 may have up to about 37 secondary coils, each producing a clock signal at approximately 2.02 mW.

One feature of the invention is illustrated in FIG. 7 concerns level translation for various classes of logic circuits. For example, while CMOS logic circuits require clock signals of 20 to 25 mW of power, they also require threshold levels of approximately 2.5 volts in a 5 volt system. Likewise, TTL logic circuits require approximately 1.6 volts threshold for clock inputs, and ECL circuits require approximately a −1.32 volt threshold. These threshold voltages can be accomplished by biasing one end (61 in FIG. 5) of the primary windings of the respective splitter circuits with a bias voltage equal to the threshold voltage required for the clock signal for the class of logic circuits driven by the splitter stage. For example, with splitter stage 92 driving clock signals for ECL logic, terminal 61 of the primary winding of the splitter stage may be connected to a source of −1.32 volts (DC). Likewise, with splitter stage 94 driving CMOS logic, its terminal 61 may be connected to a bias source of +2.5 volts (DC). To prevent the DC voltage from short circuiting through the secondary windings of the previous rank splitter stage, capacitors 106 and 108 are provided between the input of splitter stages 92 and 94 and the outputs of splitter stage 90, respectively. Capacitors 106 and 108 block DC signals generated by the bias voltages applied to terminal 61 of the primary windings of splitter stages 92 and 94, yet pass AC signals for operation of the circuit. It will be appreciated, therefore, from FIG. 7 that diverse classes of logic circuits be supported by the same clock network and that differing power levels and bias (threshold) levels can be accomplished for each such class.

Another feature illustrated in FIG. 7 resides in the fact that each splitter stage, is, in essence, a separate stage, so that the stages of the tree, such as illustrated in FIG. 3, are not required to be contiguous or even on a single board. Hence, it is possible to place different splitter stages S on different boards, connecting the input of one stage to a respective output of a prior stage through buses, back panels or other well known techniques. Hence, splitter stage 92 may be on a different circuit board from splitter stage 94, or even splitter stage 90, with the connection of output 98 from stage 90 and the input to splitter stage 92 being provided through a bus or back panel. Likewise, the connection between output 100 and the input to stages 94 may also comprise back panels, buses, or even hard wires. Capacitors 106 and 108 may be integrated into the board supporting either stage 90 or the respective stage 92 and 94, or the capacitors may be discrete elements formed in the hard wire bus. Due to the speed of the circuits involved in computing technology it may be desirable to adjust the lengths of the conductive paths between an output of one splitter stage and the inputs of the next rank of splitter stages to assure signal matching of the splitter stages at each rank, thereby avoiding introduction of delays.

Figure 8:
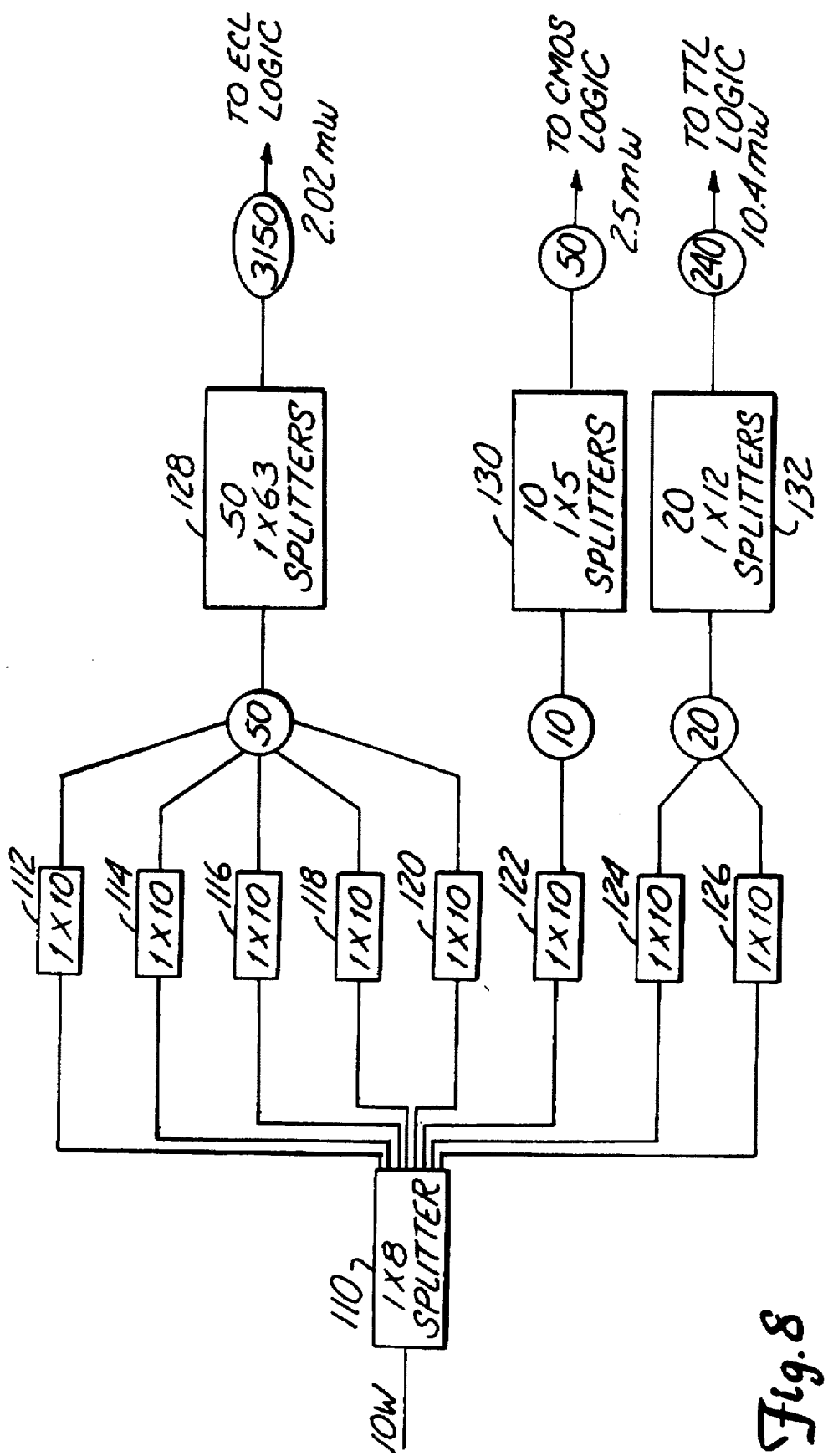
FIG. 8 is a diagram useful in the explanation of the construction and operation of a tree using plural-output stages for diverse classes of logic circuits.

As described above, the present invention permits the use of CMOS, TTL and ECL circuits in the same system, driven by a single clock distribution network. Also as described above, CMOS circuits require clock signals having about 10 times the power required for ECL circuits, and TTL circuits require clock signals having about 5 times the power requirements of ECL circuits. A 10 watt power supply would support about 5,000 ECL circuits, 1,000 TTL circuits, or 400 CMOS circuits. As shown in FIG. 7, the network will also support circuits of a variety of classes. FIG. 8 illustrates a distribution tree capable of supporting up to about 3,150 ECL circuits, 240 TTL circuits and 50 CMOS circuits. A 10 watt oscillator (power boosted if necessary) provides a 10 watt clock signal to a first rank of splitter stages consisting of a single 1×8 splitter stage 110 splitting the single 10 watt clock signal into eight 1.25 watt intermediate clock signals. The second rank of splitter stages comprises eight 1×10 splitter stages 112, 114, 116, 118, 120, 122, 124 and 126, each providing ten 0.125 watt clock outputs. The outputs of the second rank of splitter stages provide outputs to respective third-rank splitter stages. In particular, splitter stages 112 through 120 provide fifty 0.125 watt intermediate clock signals to each of fifty 1×63 splitter stages 128, each of which produces sixty-three working rank clock outputs at 2.02 mW to respective ECL circuits. Hence, the portion of the network including stages 110, 112, 114, 116, 118, 120 and 128 produce 3,150 working rank clock signals of 2.02 mW for ECL logic circuits. Likewise, splitter stage 122 provides ten 0.125 watt intermediate clock signals to each of ten 1×5 splitter stages 130, which in turn split the intermediate clock signal to provide 50 working rank clock signal outputs at 25 mW for CMOS circuits. Likewise, splitter circuits 124 and 126 provide twenty intermediate clock signals to each of twenty 1×12 splitter stages 132, which in turn split the intermediate clock signals to provide 240 working rank clock signal outputs at 10.4 mW for TTL circuits.

To produce square wave signals with the transformer, it is necessary that the transformer operate on the fundamental signal frequency of the square wave signal, and on at least the third, and preferably also the fifth harmonic, to achieve a good definition of the edge of the square wave pulse. Greater precision, is, of course, achieved with even higher harmonics. Thus, for a 33 MHz square wave signal, the splitter must be capable of supporting frequencies up to 100 MHz with periods of about 10 nsec.

The transformer forming the splitter stage may introduce a small amount of skew. More particularly, due to mechanical differences between the input and output windings (inductance, capacitance, line length, etc.), at 100 MHz, a phase imbalance of ±2 degrees may result in as much as ±55.5 psec skew error, or a 111 psec window of error. Accumulating the skew error through three ranks of splitter stages, the splitter network of the present invention produces a worst-case of approximately 333 psec skew. Thus, operating with a 33 MHz clock signal having a period of about 30 nsec, the worst case skew of the three-level splitter network of the present invention is of the order of 1% of the clock period. This represents a significant improvement over a single rank of active regeneration circuits, such as PLLs, that produce a best-case skew of about 500 psec (1.5% of the clock period) and more typically produce skews of up to 2 nsec (6.6% of the clock period). Thus, where three ranks of splitter stages according to the present invention produce a worst case skew of approximately 333 psec (less than 1% of the clock period), three ranks of PLL produce a best case skew of 1.5 nsec (about 5% of the clock period) and more typically a skew of about 6 nsec (about 20% of the clock cycle).

Although the present invention has been described in conjunction with diverse classes of logic circuits such as CMOS, TTL and ECL, it should be readily apparent to those skilled in the art that the distribution network is useful with other classes of logic circuits, including law voltage differential signaling (LVDS) circuits.

The present invention thus provides an electronic splitter for splitting clock signals for plural logic circuits without introducing significant clock skew between working rank clock signals. The circuit is useful in providing clock signals to various powers to various logic devices, thereby permitting use of diverse classes of logic devices.

Although the present invention has been described with reference to preferred embodiments, workers skilled in the art will recognize that changes may be made in form and detail without departing from the spirit and scope of the invention.

What is claimed is:

1. An electronic digital clock distribution system for providing a plurality of working rank clock signals to respective ones of a plurality of logic circuits, each clock signal having a predetermined frequency and each logic circuit requiring a working rank clock signal having a predetermined level of electrical power, the system comprising:

oscillator means for producing a master clock signal having the predetermined frequency and an electrical power level at least equal to the sum of the power requirements for all working rank clock signals of the plurality of logic circuits; and an electronic splitter network connected to the oscillator means for splitting the master clock signal into the plurality of working rank clock signals.

2. The electronic digital clock distribution system of claim 1 wherein the oscillator means comprises an oscillator producing a source clock signal having the predetermined frequency and a power incapable of providing adequate electrical power for all working rank clock signals of the plurality of logic circuits, and a power booster connected to the oscillator for increasing the power of the source clock signal to the level of the master clock signal.

3. The electronic digital clock distribution system of claim 1 wherein the electronic splitter network includes a cascaded tree containing a plurality of ranks of splitter stages, each splitter stage having a plurality of outputs.

4. The electronic digital clock distribution system of claim 3 wherein each splitter stage includes a primary winding coupled to at least one secondary winding, the primary winding having an input arranged to receive a clock signal and the secondary winding providing n outputs each arranged to provide a clock signal, each output clock signal having a power approximately 1/n the power of the input clock signal.

5. The electronic digital clock distribution system of claim 4 wherein the splitter stage includes n secondary windings, each connected between a respective output and an impedance matching tap of the primary winding.

6. The electronic digital clock distribution system of claim 5 including n load impedances, each connected between a respective output and an impedance bus.

7. The electronic digital clock distribution system of claim 5 wherein the primary winding has a first end connected to the input and a second end connected to a source of bias voltage.

8. The electronic digital clock distribution system of claim 3 wherein there are at least two ranks of splitter stages, a first rank comprising a single splitter stage receiving the master clock signal as an input and the splitter stages forming the nth rank of splitter stages provide the plurality of working rank clock signals, each splitter stage forming the first through n−1 rank splitter stages providing intermediate clock signals to respective splitter stages forming the next higher rank of splitter stages and each splitter stage forming the second through nth rank splitter stages receiving intermediate clock signal signals from respective splitter stages forming the next lower rank of splitter stages.

9. The electronic digital clock distribution system of claim 1 wherein the oscillator means includes a crystal oscillator.

10. An electronic digital clock distribution system for providing a plurality of working rank clock signals to respective ones of a plurality of logic circuits, each clock signal having a predetermined frequency, the system comprising:

an oscillator producing a master clock signal having the predetermined frequency and an electrical power level less than the sum of the power requirements for all working rank clock signals of the plurality of logic circuits;

a power booster connected to the oscillator for increasing the power of the master clock signal to a power level at least equal to the sum of the power requirements for all working rank clock signals of the plurality of logic circuits;

an electronic splitter network connected to the power booster for splitting the master clock signal into the plurality of working rank clock signals, the electronic splitter network comprising a plurality of ranks of splitter stages, each splitter stage having a primary winding having first and second ends and an impedance matching tap, an input connected to a first end of the primary winding and arranged to receive a clock signal, a plurality of secondary windings coupled to the primary winding, each secondary winding having a first end connected to a respective output to provide a respective output clock signal having a power approximately 1/n the power of the input clock signal, each secondary winding further having a second end connected to the impedance matching tap of the primary winding, and a source of bias voltage connected to the second end of the primary winding, respective ones of a first group of the logic circuits being connected to respective ones of the outputs of a first splitter stage, and respective ones of a second group of the logic circuits being connected to respective ones of the outputs of a second splitter stage, the logic circuits of the first group being of a first class requiring working rank clock signals having a first predetermined bias level and the logic circuits of the second group being of a second class requiring working rank clock signals having a second predetermined bias level, the source of bias voltage connected to the second end of the primary winding of the first splitter stage having the first predetermined bias level and the source of bias voltage connected to the second end of the primary winding of the second splitter stage having the second predetermined bias level.

11. The electronic digital clock distribution system of claim 10 wherein the logic circuits of the first group require working rank clock signals additionally having a first predetermined power level and the logic circuits of the second group require working rank clock signals additionally having a second predetermined power level, the secondary windings of the first splitter stage providing respective output clock signals having a power at least as great as the first predetermined power level and the secondary windings of the second splitter stage providing respective output clock signals having a power at least as great as the second predetermined power level.

12. The electronic digital clock distribution system of claim 10 further including a plurality of load impedances, each connected between a respective output of the secondary windings and a common impedance bus.

* * * * *

UNITED STATES PATENT AND TRADEMARK OFFICE
CERTIFICATE OF CORRECTION

PATENT NO. : 5,627,482

DATED : MAY 6, 1997

INVENTOR(S) : MICHAEL JOHN LAMATSCH

It is certified that error appears in the above-indentified patent and that said Letters Patent is hereby corrected as shown below:

Title page,

Under OTHER PUBLICATIONS, page 2, Col. 2, line 24, delete "Clonference", insert --Conference--

Under OTHER PUBLICATIONS, page 2, Col. 2, line 43, delete "wageguides", insert --waveguides--

Col. 3, line 57, delete "states", insert --stages--

Col. 10, line 37, delete "law", insert --low--

Signed and Sealed this

Twenty-third Day of September, 1997

Attest:

BRUCE LEHMAN

*Attesting Officer*  *Commissioner of Patents and Trademarks*